(12) United States Patent
Miyamoto et al.

(10) Patent No.: US 11,375,624 B2
(45) Date of Patent: Jun. 28, 2022

(54) SURFACE TREATED COPPER FOIL, COPPER CLAD LAMINATE, AND PRINTED CIRCUIT BOARD

(71) Applicant: JX Nippon Mining & Metals Corporation, Tokyo (JP)

(72) Inventors: Nobuaki Miyamoto, Ibaraki (JP); Atsushi Miki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 261 days.

(21) Appl. No.: 16/498,003

(22) PCT Filed: Apr. 22, 2019

(86) PCT No.: PCT/JP2019/017092
§ 371 (c)(1),
(2) Date: Sep. 26, 2019

(87) PCT Pub. No.: WO2019/208521
PCT Pub. Date: Oct. 31, 2019

(65) Prior Publication Data
US 2021/0331449 A1 Oct. 28, 2021

(30) Foreign Application Priority Data

Apr. 27, 2018 (JP) .............................. JP2018-087551
Apr. 27, 2018 (JP) .............................. JP2018-087554
(Continued)

(51) Int. Cl.
*H05K 1/03* (2006.01)
*H05K 1/05* (2006.01)
(Continued)

(52) U.S. Cl.
CPC ............. *H05K 3/384* (2013.01); *B32B 15/01* (2013.01); *B32B 15/04* (2013.01); *B32B 15/20* (2013.01);
(Continued)

(58) Field of Classification Search
CPC .. H05K 1/03; H05K 1/05; H05K 1/09; H05K 1/14; H05K 3/00; H05K 3/02; H05K 3/06;
(Continued)

(56) References Cited

U.S. PATENT DOCUMENTS 5,389,446 A * 2/1995 Yamanishi ............... C25D 3/56
428/472
5,456,817 A * 10/1995 Hino ...................... C23C 22/24
148/241
(Continued)

FOREIGN PATENT DOCUMENTS

EP   2444530 A1   4/2012
JP   2849059 B2   1/1999
(Continued)

OTHER PUBLICATIONS

Office action dated Aug. 13, 2021 in co-pending U.S. Appl. No. 16/498,032.
(Continued)

*Primary Examiner* — Xiaoliang Chen
(74) *Attorney, Agent, or Firm* — Nields, Lemack & Frame, LLC

(57) ABSTRACT

A surface treated copper foil 1 includes a copper foil 2, and a first surface treatment layer 3 formed on one surface of the copper foil 2. The first surface treatment layer 3 of the surface treated copper foil 1 has a Ni deposited amount of 20 to 200 µg/dm² and a Zn deposited amount of 20 to 1,000 µg/dm². A copper clad laminate 10 includes the surface
(Continued)

treated copper foil 1 and an insulating substrate 11 adhered to the first surface treatment layer 3 of the surface treated copper foil 1.

19 Claims, 2 Drawing Sheets

(30) Foreign Application Priority Data

May 31, 2018 (JP) .............................. JP2018-105116
Jul. 19, 2018 (JP) .............................. JP2018-136096

(51) Int. Cl.

| | | |
|---|---|---|
| *H05K 1/09* | (2006.01) | |
| *H05K 1/14* | (2006.01) | |
| *H05K 3/00* | (2006.01) | |
| *H05K 3/02* | (2006.01) | |
| *H05K 3/06* | (2006.01) | |
| *H05K 3/36* | (2006.01) | |
| *H05K 3/38* | (2006.01) | |
| *B32B 15/01* | (2006.01) | |
| *B32B 15/08* | (2006.01) | |
| *C25D 5/10* | (2006.01) | |
| *C25D 5/16* | (2006.01) | |
| *C25D 5/00* | (2006.01) | |
| *C25D 5/12* | (2006.01) | |
| *B32B 15/04* | (2006.01) | |
| *B32B 15/20* | (2006.01) | |
| *C22C 9/04* | (2006.01) | |
| *C25D 5/14* | (2006.01) | |
| *C25D 3/04* | (2006.01) | |
| *C25D 3/12* | (2006.01) | |
| *C25D 3/38* | (2006.01) | |
| *C25D 3/56* | (2006.01) | |
| *C25D 11/38* | (2006.01) | |

(52) U.S. Cl.
CPC ................. *C22C 9/04* (2013.01); *C25D 5/12* (2013.01); *C25D 5/605* (2020.08); *C25D 5/627* (2020.08); *H05K 1/09* (2013.01); *H05K 3/022* (2013.01); *H05K 3/06* (2013.01); *B32B 2307/206* (2013.01); *B32B 2457/08* (2013.01); *C25D 3/04* (2013.01); *C25D 3/12* (2013.01); *C25D 3/38* (2013.01); *C25D 3/562* (2013.01); *C25D 5/14* (2013.01); *C25D 11/38* (2013.01); *H05K 2201/0338* (2013.01); *H05K 2201/0355* (2013.01); *H05K 2203/0307* (2013.01)

(58) Field of Classification Search
CPC . H05K 3/36; H05K 3/38; B32B 15/01; B32B 15/08; C25D 5/10; C25D 5/16
USPC ............... 174/257, 250, 254; 361/784, 751; 428/457, 458, 548, 551, 553, 555, 606, 428/607, 632, 633, 674, 675
See application file for complete search history.

(56) References Cited

U.S. PATENT DOCUMENTS

| | | | |
|---|---|---|---|
| 5,552,234 A * | 9/1996 | Kawasumi | C25D 5/34 428/632 |
| 6,319,621 B1 * | 11/2001 | Arai | H05K 3/384 428/658 |
| 8,142,905 B2 | 3/2012 | Moriyama et al. | |
| 2002/0053517 A1 * | 5/2002 | Endo | C25D 5/10 205/182 |
| 2002/0182433 A1 * | 12/2002 | Endo | H05K 3/384 428/606 |
| 2003/0031888 A1 * | 2/2003 | Kitano | B23K 26/382 428/607 |
| 2004/0191560 A1 | 9/2004 | Matsuda et al. | |
| 2010/0212941 A1 * | 8/2010 | Higuchi | H05K 3/384 174/257 |
| 2010/0261033 A1 * | 10/2010 | Moriyama | C25D 3/562 428/607 |
| 2011/0189501 A1 * | 8/2011 | Fujisawa | C25D 3/565 428/623 |
| 2011/0259848 A1 * | 10/2011 | Yamanishi | C23C 22/24 216/13 |
| 2011/0262764 A1 * | 10/2011 | Arai | C25D 5/605 428/551 |
| 2011/0284496 A1 * | 11/2011 | Yamanishi | C25D 5/022 216/20 |
| 2011/0293960 A1 * | 12/2011 | Yamanishi | C25D 5/022 428/607 |
| 2011/0297641 A1 * | 12/2011 | Yamanishi | B32B 15/018 216/13 |
| 2011/0300401 A1 * | 12/2011 | Yamanishi | C23C 26/00 428/607 |
| 2012/0135266 A1 * | 5/2012 | Kaminaga | B32B 15/01 428/624 |
| 2012/0148862 A1 * | 6/2012 | Moriyama | C23C 28/3455 428/607 |
| 2012/0276412 A1 * | 11/2012 | Miki | C23C 28/3455 428/671 |
| 2013/0011690 A1 * | 1/2013 | Arai | H05K 1/09 428/548 |
| 2013/0040162 A1 | 2/2013 | Fujisawa et al. | |
| 2014/0016348 A1 | 1/2014 | Iwasaki | |
| 2014/0057123 A1 * | 2/2014 | Arai | C25D 7/0614 428/551 |
| 2014/0093743 A1 * | 4/2014 | Arai | C25D 5/605 428/551 |
| 2014/0146454 A1 | 5/2014 | Nozawa | |
| 2014/0355229 A1 * | 12/2014 | Arai | H05K 3/36 361/751 |
| 2015/0008020 A1 | 1/2015 | Kaneko et al. | |
| 2015/0047884 A1 | 2/2015 | Nagaura et al. | |
| 2015/0079415 A1 * | 3/2015 | Fukuchi | C23C 22/83 428/552 |
| 2015/0237737 A1 * | 8/2015 | Arai | H05K 1/0346 361/784 |
| 2015/0245477 A1 * | 8/2015 | Arai | C25D 7/0692 174/250 |
| 2016/0189986 A1 | 6/2016 | Kasai et al. | |
| 2016/0242281 A1 | 8/2016 | Nagaura et al. | |
| 2016/0286665 A1 * | 9/2016 | Arai | C25D 5/605 |
| 2016/0303829 A1 * | 10/2016 | Arai | H05K 3/30 |
| 2016/0374205 A1 * | 12/2016 | Moriyama | H05K 3/025 |
| 2017/0032978 A1 * | 2/2017 | Moriyama | H01L 21/486 |
| 2017/0034926 A1 * | 2/2017 | Moriyama | H05K 3/4682 |
| 2017/0144355 A1 | 5/2017 | Kuwabara et al. | |
| 2017/0336535 A1 | 11/2017 | Shima et al. | |
| 2018/0160529 A1 * | 6/2018 | Arai | H05K 3/384 |
| 2018/0226655 A1 * | 8/2018 | Arai | H01M 4/70 |
| 2018/0228029 A1 * | 8/2018 | Moriyama | C25D 5/605 |
| 2018/0255646 A1 * | 9/2018 | Moriyama | H05K 3/3473 |
| 2018/0288867 A1 * | 10/2018 | Fukuchi | B32B 27/306 |
| 2019/0145014 A1 * | 5/2019 | Chen | C25D 1/04 205/152 |
| 2021/0337664 A1 | 10/2021 | Miyamoto et al. | |
| 2021/0360785 A1 | 11/2021 | Miyamoto et al. | |
| 2021/0362475 A1 | 11/2021 | Miyamoto et al. | |

FOREIGN PATENT DOCUMENTS

| | | |
|---|---|---|
| JP | 2011-9267 A | 1/2011 |
| JP | 5204908 B1 | 6/2013 |
| JP | 2016-010961 A | 1/2016 |
| KR | 2012-0135197 A | 12/2012 |
| PH | 12014000344 A1 | 6/2016 |
| TW | I422484 B | 1/2014 |
| TW | 201526726 A | 7/2015 |

(56) References Cited

FOREIGN PATENT DOCUMENTS

| TW | I530234 B | 4/2016 |
|----|-----------|--------|
| TW | 201619448 A | 6/2016 |
| TW | I619409 B | 3/2018 |
| WO | 2010/074053 A1 | 7/2010 |
| WO | 2010/074061 A1 | 7/2010 |
| WO | 2010/074072 A1 | 7/2010 |
| WO | 2010/147013 A1 | 12/2010 |
| WO | 2011/105318 A1 | 9/2011 |
| WO | 2016/035604 A1 | 3/2016 |
| WO | 2016/038923 A1 | 3/2016 |
| WO | 2017/006739 A1 | 1/2017 |

OTHER PUBLICATIONS

International Search Report dated Jun. 11, 2019 in co-pending PCT application No. PCT/JP2019/017096.
International Search Report dated Jun. 11, 2019 in corresponding PCT application No. PCT/JP2019/017092.
International Search Report dated Jun. 11, 2019 in co-pending PCT application No. PCT/JP2019/017091.
International Search Report dated Jun. 11, 2019 in co-pending PCT application No. PCT/JP2019/017093.
Office action dated Sep. 28, 2021 in co-pending U.S. Appl. No. 16/497,996.
International Preliminary Report on Patentability dated Nov. 5, 2020 in co-pending PCT application No. PCT/JP2019/017096.
International Preliminary Report on Patentability dated Nov. 5, 2020 in corresponding PCT application No. PCT/JP2019/017092.
International Preliminary Report on Patentability dated Nov. 5, 2020 in co-pending PCT application No. PCT/JP2019/017091.
International Preliminary Report on Patentability dated Nov. 5, 2020 in co-pending PCT application No. PCT/JP2019/017093.
European communication dated Dec. 7, 2021 in corresponding European patent application No. 19793376.5.
Korean communication, with English translation, dated Oct. 26, 2021 in co-pending Korean patent application No. 10-2020-7029313.
Final rejection dated Jan. 21, 2022 in co-pending U.S. Appl. No. 16/498,010.
Office action dated Oct. 22, 2021 in co-pending U.S. Appl. No. 16/498,010.
Final Rejection dated Oct. 28, 2021 in co-pending U.S. Appl. No. 16/498,032.
Notice of Allowance dated Feb. 7, 2022 in co-pending U.S. Appl. No. 16/497,996.
Notice of allowance dated Mar. 1, 2022 in co-pending U.S. Appl. No. 16/498,032.
Notice of allowance dated May 3, 2022 in co-pending U.S. Appl. No. 16/498,010.

* cited by examiner

[Figure 1]
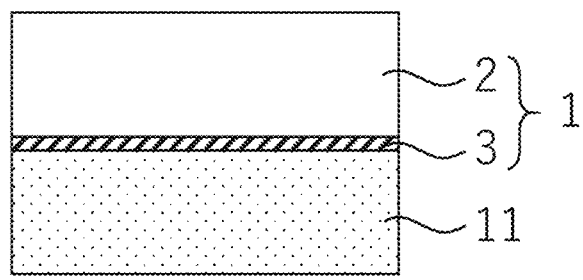
[Figure 2]
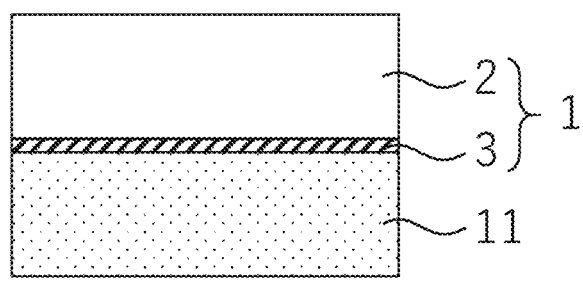

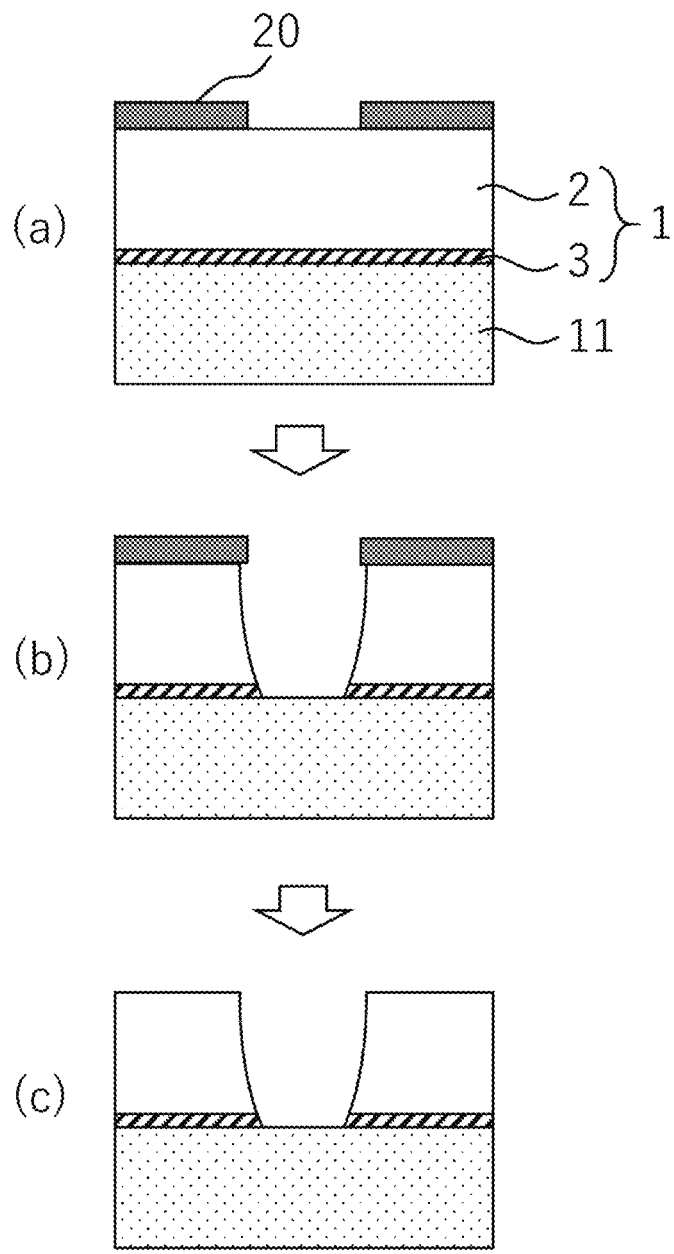
[Figure 3]

SURFACE TREATED COPPER FOIL, COPPER CLAD LAMINATE, AND PRINTED CIRCUIT BOARD

TECHNICAL FIELD

The present disclosure relates to a surface treated copper foil, a copper clad laminate, and a printed circuit board.

BACKGROUND ART

Associated with the increase of needs in electronic devices, such as reduction in size and enhancement of capability, in recent years, there has been a demand of reduction in pitch (miniaturization) of a circuit pattern (which may be referred to as a conductor pattern) of a printed circuit board mounted on the electronic devices.

Various methods, such as a subtractive method and a semi-additive method, have been known as a production method of the printed circuit board. In the subtractive method among these, an insulating substrate is adhered to a copper foil to form a copper clad laminate, then a resist is coated on the surface of the copper foil and then exposed to form a prescribed resist pattern, and the portion having no resist pattern formed (i.e., the unnecessary portion) is removed by etching, so as to form a circuit pattern.

For addressing the needs of reduction in pitch described above, for example, PTL 1 describes that the surface of a copper foil is subjected to a roughening treatment through copper-cobalt-nickel alloy plating, on which a cobalt-nickel alloy plated layer is then formed, and a zinc-nickel alloy plated layer is further formed thereon, so as to provide a surface treated copper foil that is capable of achieving the reduction in pitch of the circuit pattern.

CITATION LIST

Patent Literature

PTL 1: Japanese Patent No. 2,849,059

SUMMARY OF INVENTION

Technical Problem

However, in the ordinary surface treated copper foil, the etching rate of the surface treatment layer (plated layer) is smaller than the etching rate of the copper foil, and therefore there is a problem that the copper foil is etched in a tapered shape expanding from the surface of the copper foil (top) to the insulating substrate (bottom), so as to lower the etching factor of the circuit pattern. In a circuit pattern having a low etching factor, the space between the circuits adjacent to each other is necessarily increased, which makes difficult the reduction in pitch of the circuit pattern.

One or more embodiments of the present application have been made for solving the aforementioned problem, and an object thereof is to provide a surface treated copper foil and a copper clad laminate that are suitable for the reduction in pitch of the circuit pattern and capable of forming a circuit pattern having a high etching factor.

Another object of one or more embodiments of the present application is to provide a printed circuit board that has a circuit pattern having a high etching factor.

Solution to Problem

The present inventors have made earnest investigations for solving the problem, and as a result, have found that the etching factor of the circuit pattern can be enhanced in such a manner that on a surface treatment layer formed on one surface of a copper foil, the deposited amount of Ni which is hardly soluble in an etching solution and the deposited amount of Zn which is readily soluble in an etching solution are controlled to particular ranges, and thus one or more embodiments of the present application have been completed.

Accordingly, one or more embodiments of the present application relate to a surface treated copper foil including a copper foil, and a first surface treatment layer formed on one surface of the copper foil, wherein the first surface treatment layer has a deposited amount of Ni of 20 to 200 $\mu g/dm^2$ and a deposited amount of Zn of 20 to 1,000 $\mu g/dm^2$.

One or more embodiments of the present application also relate to a copper clad laminate including the surface treated copper foil and an insulating substrate adhered to the first surface treatment layer of the surface treated copper foil.

One or more embodiments of the present application also relate to a printed circuit board including a circuit pattern formed by etching the surface treated copper foil of the copper clad laminate.

Advantageous Effects of Invention

According to one or more embodiments of the present application, a surface treated copper foil and a copper clad laminate that are suitable for the reduction in pitch of the circuit pattern and capable of forming a circuit pattern having a high etching factor can be provided.

According to one or more embodiments of the present application, a printed circuit board that has a circuit pattern having a high etching factor can also be provided.

BRIEF DESCRIPTION OF DRAWINGS

FIG. 1 is a cross sectional view showing a copper clad laminate using a surface treated copper foil of one or more embodiments of the present application.

FIG. 2 is a cross sectional view showing a copper clad laminate using a surface treated copper foil further having a second surface treatment layer of one or more embodiments of the present application.

FIG. 3 is a cross sectional view showing a production method of a printed circuit board by a subtractive method.

DESCRIPTION OF EMBODIMENTS

One or more preferred embodiments of the present application will be specifically described below, but the one or more embodiments of the present application are not limited thereto and may be subjected to various changes and improvements by a skilled person in the art unless the changes and improvements deviate the one or more embodiments of the present application. The plural constitutional elements described in the one or more embodiments may form various inventions through appropriate combinations thereof. For example, some of the constitutional elements may be deleted from all the constitutional elements shown in the one or more embodiments, and the constitutional elements of other one or more embodiments may be appropriately combined therewith.

FIG. 1 is a cross sectional view showing a copper clad laminate using a surface treated copper foil of one or more embodiments of the present application.

The surface treated copper foil 1 has a copper foil 2, and a first surface treatment layer 3 formed on one surface of the copper foil 2. The copper clad laminate 10 has the surface treated copper foil 1 and an insulating substrate 11 adhered to the first surface treatment layer 3 of the surface treated copper foil 1.

The first surface treatment layer 3 contains at least Ni and Zn as deposited elements.

Ni is a component that is hardly soluble in the etching solution, and therefore, by controlling the deposited amount of Ni of the first surface treatment layer 3 to 200 μg/dm$^2$ or less, the first surface treatment layer 3 becomes readily soluble in the etching solution. As a result, the etching factor of the circuit pattern can be enhanced. From the standpoint of the stable enhancement of the etching factor, the deposited amount of Ni of the first surface treatment layer 3 is preferably controlled to 180 μg/dm$^2$ or less, and more preferably 100 μg/dm$^2$ or less. From the standpoint of the securement of the prescribed effects (such as the heat resistance) by the first surface treatment layer 3, the deposited amount of Ni of the first surface treatment layer 3 may be controlled to 20 μg/dm$^2$ or more.

A surface treatment, such as gold plating, may be performed in some cases after forming the circuit pattern, and in the case where soft etching is performed as a pretreatment for removing unnecessary substances from the surface of the circuit pattern, the soft etching solution may infiltrate to the edge portion of the circuit pattern in some cases. Ni has an effect of preventing the infiltration of the soft etching solution. From the standpoint of the sufficient securement of the effect, the deposited amount of Ni of the first surface treatment layer 3 is preferably controlled to 30 μg/dm$^2$ or more, and more preferably controlled to 40 μg/dm$^2$ or more.

Zn is readily soluble in the etching solution, and therefore, a relatively large amount thereof may be deposited. Accordingly, by controlling the deposited amount of Zn of the first surface treatment layer 3 to 1,000 μg/dm$^2$ or less, the first surface treatment layer 3 becomes readily soluble, and thereby the etching factor of the circuit pattern can be enhanced. From the standpoint of the stable enhancement of the etching factor, the deposited amount of Zn of the first surface treatment layer 3 is preferably controlled to 700 μg/dm$^2$ or less, and more preferably controlled to 600 μg/dm$^2$ or less. From the standpoint of the securement of the prescribed effects (such as the heat resistance and the chemical resistance) by the first surface treatment layer 3, the deposited amount of Zn of the first surface treatment layer 3 may be controlled to 20 μg/dm$^2$ or more, preferably 100 μg/dm$^2$ or more, and more preferably 300 μg/dm$^2$ or more. For example, Zn has a barrier effect of preventing heat diffusion of copper, and thus can suppress the roughening particles and copper in the copper foil from being exposed to the surface layer through the heat diffusion. As a result, copper can be prevented from being in direct contact with a chemical solution, such as a soft etching solution, and thereby the soft etching solution can be suppressed from infiltrating to the edge portion of the circuit pattern.

The first surface treatment layer 3 may contain elements, such as Co and Cr, as deposited elements, in addition to Ni and Zn.

The deposited amount of Co of the first surface treatment layer 3 is not particularly limited since the deposited amount thereof depends on the kind of the first surface treatment layer 3, and is preferably 1,500 μg/dm$^2$ or less, more preferably 500 μg/dm$^2$ or less, further preferably 100 μg/dm$^2$ or less, and particularly preferably 30 μg/dm$^2$ or less. By controlling the deposited amount of Co of the first surface treatment layer 3 to the range, the etching factor of the circuit pattern can be stably enhanced. The lower limit of the deposited amount of Co is not particularly limited, and is typically 0.1 μg/dm$^2$, and is preferably 0.5 μg/d m$^2$.

Since Co is a magnetic metal, the surface treated copper foil 1 that is capable of producing a printed circuit board excellent in high frequency characteristics can be obtained by suppressing the deposited amount of Co of the first surface treatment layer 3 particularly to 100 μg/dm$^2$ or less, and preferably 0.5 to 100 μg/dm$^2$.

The deposited amount of Cr of the first surface treatment layer 3 is not particularly limited since the deposited amount thereof depends on the kind of the first surface treatment layer 3, and is preferably 500 μg/dm$^2$ or less, more preferably from 0.5 to 300 μg/dm$^2$, and further preferably from 1 to 100 μg/dm$^2$. By controlling the deposited amount of Cr of the first surface treatment layer 3 to the range, a rust preventing effect can be obtained, and simultaneously the etching factor of the circuit pattern can be stably enhanced.

The Rz of the first surface treatment layer 3 is not particularly limited, and is preferably from 0.3 to 1.5 μm, more preferably from 0.4 to 1.2 μm, and further preferably from 0.5 to 0.9 μm. By controlling the Rz of the first surface treatment layer 3 to the range, the adhesion to the insulating substrate 11 can be enhanced.

In the description herein, "Rz" means the ten-point surface roughness defined in JIS B0601:1994.

The kind of the first surface treatment layer 3 is not particularly limited, as far as the deposited amount of Ni and the deposited amount of Zn are in the aforementioned ranges, and various surface treatment layers having been known in this field of art may be used. Examples of the surface treatment layer include a roughening treatment layer, a heat resistant layer, a rust preventing layer, a chromate treatment layer, and a silane coupling treatment layer. These layers may be used solely or as a combination of two or more kinds thereof. Among these, the first surface treatment layer 3 preferably includes a roughening treatment layer from the standpoint of the adhesion to the insulating substrate 11.

In the description herein, the "roughening treatment layer" is a layer that is formed through a roughening treatment, and includes a layer of roughening particles. In the roughening treatment, there are some cases where ordinary copper plating or the like may be performed as a pretreatment thereof, and ordinary copper plating or the like may be performed as a finishing treatment for preventing the roughening particles from dropping off, and the "roughening treatment layer" in the description herein includes the layers formed through the pretreatment and the finishing treatment.

The roughening particles are not particularly limited, and may be formed of an elemental substance selected from the group consisting of copper, nickel, cobalt, phosphorus, tungsten, arsenic, molybdenum, chromium, and zinc, or an alloy containing at least one thereof. After forming the roughening particles, a roughening treatment may further be performed by providing secondary particles or tertiary particles formed of an elemental substance or an alloy of nickel, cobalt, copper, or zinc, or the like.

The roughening treatment layer may be formed through electroplating, the condition for which is not particularly limited, and the condition may be typically as follows. The electroplating may be performed by dividing into two stages.

Plating solution composition: 10 to 20 g/L of Cu and 50 to 100 g/L of sulfuric acid Plating solution temperature: 25 to 50° C.

Electroplating condition: current density of 1 to 60 A/dm$^2$ and a time of 1 to 10 seconds The heat resistant layer and the rust preventing layer are not particularly limited, and may be formed of materials having been known in this field of art. The heat resistant layer may function as the rust preventing layer in some cases, and therefore, one layer having both the functions of the heat resistant layer and the rust preventing layer may be formed as the heat resistant layer and the rust preventing layer.

The heat resistant layer and/or the rust preventing layer may be a layer that contains at least one element (which may be in the form of any of a metal, an alloy, an oxide, a nitride, a sulfide, and the like) selected from the group consisting of nickel, zinc, tin, cobalt, molybdenum, copper, tungsten, phosphorus, arsenic, chromium, vanadium, titanium, aluminum, gold, silver, a platinum group element, iron, and tantalum. Examples of the heat resistant layer and/or the rust preventing layer include a layer containing a nickel-zinc alloy.

The heat resistant layer and the rust preventing layer may be formed through electroplating, the condition for which is not particularly limited, and the condition for a typical heat resistant layer (Ni—Zn layer) may be as follows.

Plating solution composition: 1 to 30 g/L of Ni and 1 to 30 g/L of Zn

Plating solution pH: 2 to 5

Plating solution temperature: 30 to 50° C.

Electroplating condition: current density of 1 to 10 A/dm$^2$ and a time of 0.1 to 5 seconds The chromate treatment layer is not particularly limited, and may be formed of materials having been known in this field of art.

In the description herein, the "chromate treatment layer" means a layer that is formed with a solution containing chromic anhydride, chromic acid, dichromic acid, a chromate salt, or a dichromate salt. The chromate treatment layer may be a layer that contains an element (which may be in the form of any of a metal, an alloy, an oxide, a nitride, a sulfide, and the like) of cobalt, iron, nickel, molybdenum, zinc, tantalum, copper, aluminum, phosphorus, tungsten, tin, arsenic, titanium, or the like. Examples of the chromate treatment layer include a chromate treatment layer that is formed by treating with a chromic anhydride or potassium dichromate aqueous solution, and a chromate treatment layer that is formed by treating with a treatment solution containing chromic anhydride or potassium dichromate, and zinc.

The chromate treatment layer may be formed by a dip chromate treatment. The condition therefor is not particularly limited, and the condition for a typical chromate treatment layer is as follows.

Chromate solution composition: 1 to 10 g/L of $K_2Cr_2O_7$ and 0.01 to 10 g/L of Zn Chromate solution pH: 2 to 5

Chromate solution temperature: 30 to 50° C.

The silane coupling treatment layer is not particularly limited, and may be formed of materials having been known in this field of art.

In the description herein, the "silane coupling treatment layer" means a layer that is formed with a silane coupling agent.

The silane coupling agent is not particularly limited, and materials having been known in this field of art may be used. Examples of the silane coupling agent include an amino silane coupling agent, an epoxy silane coupling agent, and a mercapto silane coupling agent. These compounds may be used solely or as a combination of two or more kinds thereof.

The silane coupling agent may be produced by a known method, and a commercially available product may also be used. Examples of the commercially available product that can be used as the silane coupling agent include KBM Series and KBE Series, produced by Shin-Etsu Chemical Co., Ltd. The commercially available product of the silane coupling agent may be used solely, and from the standpoint of the adhesion (peel strength) between the first surface treatment layer 3 and the insulating substrate 11, a mixture of two or more kinds of the silane coupling agents is preferably used. Examples of the preferred mixture of silane coupling agents among these include a mixture of KBM 603 (N-2-(aminoethyl)-3-aminopropyltrimethoxysilane) and KBM 503 (3-methacryloxypropyltrimethoxysilane), a mixture of KBM 602 (N-2-(aminoethyl)-3-aminopropyldimethoxysilane) and KBM 503 (3-methacryloxypropyltrimethoxysilane), a mixture of KBM 603 (N-2-(aminoethyl)-3-aminopropyltrimethoxysilane) and KBE 503 (3-methacryloxypropyltriethoxysilane), a mixture of KBM 602 (N-2-(aminoethyl)-3-aminopropyldimethoxysilane) and KBE 503 (3-methacryloxypropyltriethoxysilane), a mixture of KBM 903 (3-aminopropyltrimethoxysilane) and KBM 503 (3-methacryloxypropyltrimethoxysilane), a mixture of KBE 903 (3-aminotriethoxysilane) and KBM 503 (3-methacryloxypropyltrimethoxysilane), a mixture of KBE 903 (3-aminotriethoxysilane) and KBE 503 (3-methacryloxypropyltriethoxysilane), and a mixture of KBM 903 (3-aminopropyltrimethoxysilane) and KBE 503 (3-methacryloxypropyltriethoxysilane).

In the case where a mixture of two or more kinds of the silane coupling agents is used, the mixing ratio thereof is not particularly limited and may be appropriately controlled depending on the kinds of the silane coupling agents used.

As shown in FIG. 2, the surface treated copper foil 1 may further have a second surface treatment layer 4 on the opposite surface of the copper foil 2.

The kind of the second surface treatment layer 4 is not particularly limited, and as similar to the first surface treatment layer 3, various surface treatment layers having been known in this field of art may be used. The kind of the second surface treatment layer 4 may be the same as or different from the kind of the first surface treatment layer 3.

The second surface treatment layer 4 may contain elements, such as Ni, Zn, and Cr, as deposited elements.

The ratio of the deposited amount of Ni of the first surface treatment layer 3 to the deposited amount of Ni of the second surface treatment layer 4 is preferably from 0.01 to 2.5, and more preferably from 0.6 to 2.2. Ni is a component that is hardly soluble in the etching solution, and therefore, by controlling the ratio of the deposited amounts of Ni to the range, the dissolution of the first surface treatment layer 3 becoming the bottom of the circuit pattern can be enhanced, and the dissolution of the second surface treatment layer 4 becoming the top of the circuit pattern can be suppressed, in etching the copper clad laminate 10. Accordingly, a circuit pattern that has a small difference between the top width and the bottom width and has a high etching factor can be provided.

The deposited amount of Ni of the second surface treatment layer 4 is not particularly limited since the deposited amount depends on the kind of the second surface treatment layer 4, and is preferably from 0.1 to 500 µg/dm$^2$, more preferably from 0.5 to 200 µg/dm$^2$, and further preferably from 1 to 100 µg/dm$^2$. By controlling the deposited amount of Ni of the second surface treatment layer 4 to the range, the etching factor of the circuit pattern can be stably enhanced.

The deposited amount of Zn of the second surface treatment layer 4 is not particularly limited since the deposited amount depends on the kind of the second surface treatment layer 4, and in the case where the second surface treatment layer 4 contains Zn, is preferably from 10 to 1,000 μg/dm², more preferably from 50 to 500 μg/dm², and further preferably from 100 to 300 μg/dm². By controlling the deposited amount of Zn of the second surface treatment layer 4 to the range, effects including the heat resistance and the chemical resistance can be obtained, and the etching factor of the circuit pattern can be stably enhanced.

The deposited amount of Cr of the second surface treatment layer 4 is not particularly limited since the deposited amount depends on the kind of the second surface treatment layer 4, and in the case where the second surface treatment layer 4 contains Cr, is preferably more than 0 μg/dm² and 500 μg/dm² or less, more preferably from 0.1 to 100 μg/dm², and further preferably from 1 to 50 μg/dm². By controlling the deposited amount of Cr of the second surface treatment layer 4 to the range, the rust preventing effect can be obtained, and the etching factor of the circuit pattern can be stably enhanced.

The copper foil 2 is not particularly limited, and may be either an electrolytic copper foil or a rolled copper foil. An electrolytic copper foil is generally produced by electrolytically depositing copper from a copper sulfate plating bath onto a titanium or stainless steel drum, and has a flat S surface (shine surface) formed on the side of the drum and an M surface (matt surface) on the opposite side to the S surface. In general, the M surface of the electrolytic copper foil has irregularity, and the adhesion between the first surface treatment layer 3 and the insulating substrate 11 can be enhanced by forming the first surface treatment layer 3 on the M surface, and forming the second surface treatment layer 4 on the S surface.

The material of the copper foil 2 is not particularly limited, and in the case where the copper foil 2 is a rolled copper foil, high purity copper that is generally used as a circuit pattern of a printed circuit board, such as tough pitch copper (JIS H3100, alloy number: C1100) and oxygen-free copper (JIS H3100, alloy number: C1020, or JIS H3510, alloy number: C1011), may be used. Furthermore, for example, copper alloys, such as Sn-containing copper, Ag-containing copper, a copper alloy containing Cr, Zr, or Mg, and a Corson copper alloy containing Ni and Si, may also be used. In the description herein, the "copper foil 2" is a concept including a copper alloy foil.

The thickness of the copper foil 2 is not particularly limited, and may be, for example, from 1 to 1,000 μm, or from 1 to 500 μm, or from 1 to 300 μm, or from 3 to 100 μm, or from 5 to 70 μm, or from 6 to 35 μm, or from 9 to 18 μm.

The surface treated copper foil 1 having the aforementioned structure may be produced according to a method having been known in this field of art. The deposited amounts of Ni and the ratio of the deposited amounts of Ni of the first surface treatment layer 3 and the second surface treatment layer 4 can be controlled, for example, by changing the kinds, the thickness, and the like of the surface treatment layers formed. The ten-point average roughness Rz of the first surface treatment layer 3 can be controlled, for example, by controlling the formation condition and the like of the first surface treatment layer 3.

The copper clad laminate 10 can be produced by adhering the insulating substrate 11 to the first surface treatment layer 3 of the surface treated copper foil 1.

The insulating substrate 11 is not particularly limited, and materials having been known in this field of art may be used. Examples of the insulating substrate 11 include a paper base impregnated with a phenol resin, a paper base impregnated with an epoxy resin, a synthetic fiber base impregnated with an epoxy resin, a glass cloth-paper composite base impregnated with an epoxy resin, a glass cloth-glass nonwoven cloth composite base impregnated with an epoxy resin, glass cloth base impregnated with an epoxy resin, a polyester film, a polyimide film, a liquid crystal polymer, and a fluorine resin.

The adhesion method of the surface treated copper foil 1 and the insulating substrate 11 is not particularly limited, and the adhesion may be performed by a method having been known in this field of art. For example, the surface treated copper foil 1 and the insulating substrate 11 may be laminated and subjected to thermocompression bonding.

The copper clad laminate 10 produced in the aforementioned manner may be used for the production of a printed circuit board. The production method of the printed circuit board is not particularly limited, and a known method, such as a subtractive method and a semi-additive method, may be used. Among these, the copper clad laminate 10 is optimum for the production by a subtractive method.

FIG. 3 is a cross sectional view showing a production method of a printed circuit board by a subtractive method.

In FIG. 3, firstly, a resist is coated on the surface of the surface treated copper foil 1 of the copper clad laminate 10, and then exposed and developed to form a prescribed resist pattern 20 (step (a)). Subsequently, the surface treated copper foil 1 on the portion having no resist pattern 20 formed (i.e., the unnecessary portion) is removed by etching (step (b)). Finally, the resist pattern 20 on the surface treated copper foil 1 is removed (step (c)).

The conditions in the subtractive method are not particularly limited, and the method may be performed under conditions having been known in this field of art.

EXAMPLES

One or more embodiments of the present application will be described more specifically with reference to examples below, but one or more embodiments of the present application are not limited to the examples.

Example 1

A rolled copper foil having a thickness of 12 μm (HA-V2 Foil, produced by JX Nippon Mining & Metals Corporation) was prepared. On one surface of the copper foil, a roughening treatment layer, a heat resistant layer, and a chromate treatment layer were serially formed as the first surface treatment layer, and on the other surface thereof, a heat resistant layer and a chromate treatment layer were serially formed as the second surface treatment layer, so as to provide a surface treated copper foil. The conditions for forming the layers were as follows.

<Roughening Treatment Layer of First Surface Treatment Layer>

The roughening treatment layer was formed by electroplating. The electroplating was performed by dividing to two stages.

(Condition for First Stage)

Plating solution composition: 11 g/L of Cu and 50 g/L of sulfuric acid

Plating solution temperature: 25° C.

Electroplating condition: current density of 45.0 A/dm² and a time of 1.4 seconds (Condition for Second Stage)

Plating solution composition: 20 g/L of Cu and 100 g/L of sulfuric acid

Plating solution temperature: 50° C.

Electroplating condition: current density of 4.1 A/dm² and a time of 2.8 seconds <Heat Resistant Layer of First Surface Treatment Layer>

The heat resistant layer was formed by electroplating.

Plating solution composition: 23.5 g/L of Ni and 4.5 g/L of Zn

Plating solution pH: 3.6

Plating solution temperature: 40° C.

Electroplating condition: current density of 2.1 A/dm$^2$ and a time of 0.7 second <Chromate Treatment Layer of First Surface Treatment Layer>

The chromate treatment layer was formed by electroplating.

Plating solution composition: 3.0 g/L of $K_2Cr_2O_7$ and 0.33 g/L of Zn

Plating solution pH: 3.6

Plating solution temperature: 50° C.

Electroplating condition: current density of 2.1 A/dm$^2$ and a time of 1.4 seconds <Heat Resistant Layer of Second Surface Treatment Layer>

The heat resistant layer was formed by electroplating.

Plating solution composition: 23.5 g/L of Ni and 4.5 g/L of Zn

Plating solution pH: 3.6

Plating solution temperature: 40° C.

Electroplating condition: current density of 2.1 A/dm$^2$ and a time of 0.7 second <Chromate Treatment Layer of Second Surface Treatment Layer>

The chromate treatment layer was formed by a dip chromate treatment.

Chromate solution composition: 3.0 g/L of $K_2Cr_2O_7$ and 0.33 g/L of Zn

Chromate solution pH: 3.6

Chromate solution temperature: 50° C.

Example 2

A surface treated copper foil was obtained in the same manner as in Example 1 except that the formation condition of the roughening treatment layer of the first surface treatment layer was changed as follows.

<Roughening Treatment Layer of First Surface Treatment Layer>

The roughening treatment layer was formed by electroplating. The electroplating was performed by dividing to two stages.

(Condition for First Stage)

Plating solution composition: 11 g/L of Cu and 50 g/L of sulfuric acid

Plating solution temperature: 25° C.

Electroplating condition: current density of 42.7 A/dm$^2$ and a time of 1.4 seconds (Condition for Second Stage)

Plating solution composition: 20 g/L of Cu and 100 g/L of sulfuric acid

Plating solution temperature: 50° C.

Electroplating condition: current density of 3.8 A/dm$^2$ and a time of 2.8 seconds Comparative Example 1

A rolled copper foil having a thickness of 12 μm (HA-V2 Foil, produced by JX Nippon Mining & Metals Corporation) was prepared. On one surface of the copper foil, a roughening treatment layer, a heat resistant layer (1), a heat resistant layer (2), and a chromate treatment layer were serially formed as the first surface treatment layer, and on the other surface thereof, a heat resistant layer and a chromate treatment layer were serially formed as the second surface treatment layer, so as to provide a surface treated copper foil. The conditions for forming the layers were as follows.

<Roughening Treatment Layer of First Surface Treatment Layer>

The roughening treatment layer was formed by electroplating.

Plating solution composition: 15 g/L of Cu, 7.5 g/L of Co, and 9.5 g/L of Ni

Plating solution pH: 2.4

Plating solution temperature: 36° C.

Electroplating condition: current density of 32.9 A/dm$^2$ and a time of 1.8 seconds <Heat Resistant Layer (1) of First Surface Treatment Layer>

The heat resistant layer (1) was formed by electroplating.

Plating solution composition: 3 g/L of Co and 13 g/L of Ni

Plating solution pH: 2.0

Plating solution temperature: 50° C.

Electroplating condition: current density of 18.4 A/dm$^2$ and a time of 0.4 second <Heat Resistant Layer (2) of First Surface Treatment Layer>

The heat resistant layer (2) was formed by electroplating.

Plating solution composition: 23.5 g/L of Ni and 4.5 g/L of Zn

Plating solution pH: 3.6

Plating solution temperature: 40° C.

Electroplating condition: current density of 3.5 A/dm$^2$ and a time of 0.4 second <Chromate Treatment Layer of First Surface Treatment Layer>

The chromate treatment layer was formed by a dip chromate treatment.

Chromate solution composition: 3 g/L of $K_2Cr_2O_7$ and 0.33 g/L of Zn

Chromate solution pH: 3.65

Chromate solution temperature: 50° C.

<Heat Resistant Layer of Second Surface Treatment Layer>

The heat resistant layer was formed by electroplating.

Plating solution composition: 23.5 g/L of Ni and 4.5 g/L of Zn

Plating solution pH: 3.6

Plating solution temperature: 40° C.

Electroplating condition: current density of 4.1 A/dm$^2$ and a time of 0.4 second <Chromate Treatment Layer of Second Surface Treatment Layer>

The chromate treatment layer was formed by a dip chromate treatment.

Chromate solution composition: 3 g/L of $K_2Cr_2O_7$ and 0.33 g/L of Zn

Chromate solution pH: 3.65

Chromate solution temperature: 50° C.

Comparative Example 2

A surface treated copper foil was obtained in the same manner as in Comparative Example 1 except that the formation conditions of the roughening treatment layer and the heat resistant layer (1) of the first surface treatment layer were changed as follows.

<Roughening Treatment Layer of First Surface Treatment Layer>

The roughening treatment layer was formed by electroplating.

Plating solution composition: 15 g/L of Cu, 7.5 g/L of Co, and 9.5 g/L of Ni

Plating solution pH: 2.4

Plating solution temperature: 36° C.

Electroplating condition: current density of 31.5 A/dm$^2$ and a time of 1.8 seconds <Heat Resistant Layer (1) of First Surface Treatment Layer>

The heat resistant layer (1) was formed by electroplating.

Plating solution composition: 3 g/L of Co and 13 g/L of Ni

Plating solution pH: 2.0

Plating solution temperature: 50° C.

Electroplating condition: current density of 19.1 A/dm$^2$ and a time of 0.4 second Comparative Example 3

A surface treated copper foil was obtained in the same manner as in Comparative Example 1 except that the formation conditions of the roughening treatment layer and the heat resistant layer (1) of the first surface treatment layer, and the heat resistant layer and the chromate treatment layer of the second surface treatment layer were changed as follows.

<Roughening Treatment Layer of First Surface Treatment Layer>

The roughening treatment layer was formed by electroplating.

Plating solution composition: 15 g/L of Cu, 7.5 g/L of Co, and 9.5 g/L of Ni

Plating solution pH: 2.4

Plating solution temperature: 36° C.

Electroplating condition: current density of 36.5 A/dm$^2$ and a time of 0.9 seconds <Heat Resistant Layer (1) of First Surface Treatment Layer>

The heat resistant layer (1) was formed by electroplating.

Plating solution composition: 3 g/L of Co and 13 g/L of Ni

Plating solution pH: 2.0

Plating solution temperature: 50° C.

Electroplating condition: current density of 22.2 A/dm$^2$ and a time of 0.4 second <Chromate Treatment Layer of First Surface Treatment Layer>

The chromate treatment layer was formed by electroplating.

Plating solution composition: 3 g/L of K$_2$Cr$_2$O$_7$ and 0.33 g/L of Zn

Plating solution pH: 3.65

Plating solution temperature: 50° C.

Electroplating condition: current density of 1.1 A/dm$^2$ and a time of 0.8 second <Heat Resistant Layer of Second Surface Treatment Layer>

The heat resistant layer was formed by electroplating.

Plating solution composition: 23.5 g/L of Ni and 4.5 g/L of Zn

Plating solution pH: 3.6

Plating solution temperature: 40° C.

Electroplating condition: current density of 2.6 A/dm$^2$ and a time of 0.4 second <Chromate Treatment Layer of Second Surface Treatment Layer>

The chromate treatment layer was formed by electroplating.

Plating solution composition: 3 g/L of K$_2$Cr$_2$O$_7$ and 0.33 g/L of Zn

Plating solution pH: 3.65

Plating solution temperature: 50° C.

Electroplating condition: current density of 1.2 A/dm$^2$ and a time of 0.4 second The surface treated copper foils obtained in Examples 1 and 2 and Comparative Examples 1 to 3 above were subjected to the following evaluations.

<Measurement of Deposited Amounts of Elements in First Surface Treatment Layer and Second Surface Treatment Layer>

The deposited amounts of Ni, Zn, and Co were measured in such a manner that the surface treatment layer was dissolved in nitric acid having a concentration of 20 mass %, and subjected to quantitative analysis by the atomic absorption method with an atomic absorption spectrometer produced by Varian, Inc. (Model AA240FS). The deposited amount of Cr was measured in such a manner that the surface treatment layer was dissolved in hydrochloric acid having a concentration of 7 mass %, and subjected to quantitative analysis by the atomic absorption method in the same manner as above.

<Measurement of Rz of First Surface Treatment Layer of Surface Treated Copper Foil>

Rz (ten-point average roughness) was measured according to JIS B0601:1994 with a contact roughness meter, Surfcorder SE-3C, produced by Kosaka Laboratory, Ltd. The measurement was performed with a measurement reference length of 0.8 mm, an evaluation length of 4 mm, a cutoff value of 0.25 mm, and a feed speed of 0.1 mm/sec, 10 times while changing the measurement position in the width direction of the surface treated copper foil, and the average value of the 10 measured values was designated as the evaluation result.

<Evaluation of Etching Factor>

A polyimide substrate was laminated on the first surface treatment layer of the surface treated copper foil and subjected to thermocompression bonding at 300° C. for 1 hour, so as to produce a copper clad laminate. A photosensitive resist was coated on the second surface treatment layer of the surface treated copper foil, and then exposed and developed to form a resist pattern having widths L/S=29 μm/21 μm. Thereafter, the exposed portion (i.e., the unnecessary portion) of the surface treated copper foil was removed by etching, so as to provide a printed circuit board having a copper circuit pattern having widths L/S=25 μm/25 μm. The widths L and S of the circuit pattern were the widths of the bottom of the circuit, i.e., the surface thereof in contact with the polyimide substrate. The etching was performed by spray etching under the following condition.

Etching solution: copper chloride etching solution (copper(II) chloride dihydrate: 400 g/L, 35% hydrochloric acid: 200 mL/L)

Solution temperature: 45° C.

Spray pressure: 0.18 MPa

Subsequently, the circuit pattern formed was observed with SEM, and the etching factor (EF) was obtained according to the following expression.

$$EF=(\text{circuit height})/((\text{circuit bottom width}-\text{circuit top width})/2)$$

A larger value of the etching factor means a larger tilt angle of the side wall of the circuit.

The value of EF was an average value of the results of five experiments for each of Examples and Comparative Example.

The evaluation results are shown in Table 1.

<Chromate Treatment Layer of First Surface Treatment Layer>

The chromate treatment layer was formed by electroplating.

TABLE 1

|  | First surface treatment layer | | | | Second surface treatment layer | | | Ratio of deposited amount of Ni [1] | Rz (μm) | EF |
| --- | --- | --- | --- | --- | --- | --- | --- | --- | --- | --- |
|  | Deposited amount of Ni (μg/dm$^2$) | Deposited amount of Zn (μg/dm$^2$) | Deposited amount of Co (μg/dm$^2$) | Deposited amount of Cr (μg/dm$^2$) | Deposited amount of Ni (μg/dm$^2$) | Deposited amount of Zn (μg/dm$^2$) | Deposited amount of Cr (μg/dm$^2$) | | | |
| Example 1 | 86 | 450 | 9 | 65 | 65 | 212 | 23 | 1.32 | 0.72 | 3.43 |
| Example 2 | 82 | 445 | 9 | 60 | 65 | 216 | 22 | 1.26 | 0.72 | 3.77 |
| Comparative Example 1 | 916 | 158 | 2900 | 93 | 30 | 320 | 22 | 30.53 | 0.65 | 2.51 |
| Comparative Example 2 | 820 | 120 | 2750 | 83 | 25 | 270 | 18 | 32.80 | 0.66 | 2.43 |
| Comparative Example 3 | 800 | 82 | 1880 | 80 | 38 | 189 | 22 | 21.05 | 0.40 | 2.20 |

[1] Ratio of deposited amount of Ni of first surface treatment layer to deposited amount of Ni of second surface treatment layer As shown in Table 1, the surface treated copper foils of Examples 1 and 2 each having a deposited amount of Ni of 20 to 200 μg/dm$^2$ and a deposited amount of Zn of 20 to 1,000 μg/dm$^2$ in the first surface treatment layer exhibited a high etching factor (EF), as compared to Comparative Examples 1 to 3 each having a deposited amount of Ni outside the range.

Example 3

A rolled copper foil having a thickness of 12 μm (HA-V2 Foil, produced by JX Nippon Mining & Metals Corporation) was prepared. On one surface of the copper foil, a roughening treatment layer, a heat resistant layer, and a chromate treatment layer were serially formed as the first surface treatment layer, and on the other surface thereof, a heat resistant layer and a chromate treatment layer were serially formed as the second surface treatment layer, so as to provide a surface treated copper foil. The conditions for forming the layers were as follows.

<Roughening Treatment Layer of First Surface Treatment Layer>

The roughening treatment layer was formed by electroplating. The electroplating was performed by dividing to two stages.

(Condition for First Stage)
Plating solution composition: 11 g/L of Cu and 50 g/L of sulfuric acid
Plating solution temperature: 25° C.
Electroplating condition: current density of 42.7 A/dm$^2$ and a time of 1.4 seconds (Condition for Second Stage)
Plating solution composition: 20 g/L of Cu and 100 g/L of sulfuric acid
Plating solution temperature: 50° C.
Electroplating condition: current density of 3.8 A/dm$^2$ and a time of 2.8 seconds <Heat Resistant Layer of First Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 1.1 A/dm$^2$ and a time of 0.7 second Plating solution composition: 3 g/L of K$_2$Cr$_2$O$_7$ and 0.33 g/L of Zn
Plating solution pH: 3.65
Plating solution temperature: 50° C.
Electroplating condition: current density of 2.1 A/dm$^2$ and a time of 1.4 seconds <Heat Resistant Layer of Second Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 2.8 A/dm$^2$ and a time of 0.7 second <Chromate Treatment Layer of Second Surface Treatment Layer>

The chromate treatment layer was formed by a dip chromate treatment.
Chromate solution composition: 3 g/L of K$_2$Cr$_2$O$_7$ and 0.33 g/L of Zn
Chromate solution pH: 3.65
Chromate solution temperature: 50° C.

Example 4

A surface treated copper foil was obtained in the same manner as in Example 3 except that the formation condition of the heat resistant layer of the first surface treatment layer was changed as follows.

<Heat Resistant Layer of First Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 2.1 A/dm$^2$ and a time of 0.7 second Example 5

A surface treated copper foil was obtained in the same manner as in Example 3 except that the formation condition of the heat resistant layer of the first surface treatment layer was changed as follows.

<Heat Resistant Layer of First Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 2.6 A/dm² and a time of 0.7 second Example 6

A surface treated copper foil was obtained in the same manner as in Example 3 except that the formation condition of the heat resistant layer of the first surface treatment layer was changed as follows.
<Heat Resistant Layer of First Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 4.2 A/dm² and a time of 0.7 second Example 7

A surface treated copper foil was obtained in the same manner as in Example 4 except that the formation condition of the heat resistant layer of the second surface treatment layer was changed as follows.
<Heat Resistant Layer of Second Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 2.2 A/dm² and a time of 0.7 second Example 8

A surface treated copper foil was obtained in the same manner as in Example 4 except that the formation condition of the heat resistant layer of the second surface treatment layer was changed as follows.
<Heat Resistant Layer of Second Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 3.3 A/dm² and a time of 0.7 second The surface treated copper foils obtained in Examples 3 to 8 above were subjected to the following evaluation in addition to the aforementioned evaluations.
<Evaluation of Infiltration of Soft Etching Solution to Edge Portion of Circuit Pattern>
(1) Test A
A polyimide substrate (Upilex (trade name), produced by Ube Industries, Ltd.) was laminated on the first surface treatment layer of the surface treated copper foil and subjected to thermocompression bonding at 300° C. for 1 hour, so as to produce a copper clad laminate. Subsequently, a circuit pattern having a width of 3 mm was formed by etching under the following condition.
Etching solution: copper chloride etching solution (copper(II) chloride dihydrate: 400 g/L, 35% hydrochloric acid: 200 mL/L)
Solution temperature: 45° C.
Time: appropriately controlled to make a width of the circuit pattern of 3 mm
Subsequently, the circuit pattern thus formed was subjected to soft etching under the following condition.
Soft etching solution: sodium persulfate: 50 g/L, sulfuric acid: 35 g/L
Solution temperature: 35° C.
Time: 5 minutes
Subsequently, the length of the portion where the soft etching solution infiltrated from the edge portion of the circuit pattern to the interior thereof was calculated by observing from the back surface of the polyimide substrate with an optical microscope (magnification: 200). The polyimide substrate is light permeable and thus can be observed from the back surface thereof.
(2) Test B
The evaluation was performed in the same manner as the test A except that the soft etching solution was sodium persulfate of 50 g/L.
(3) Test C
A polyamic acid varnish (produced by Ube Industries, Ltd.) was coated on the first surface treatment layer of the surface treated copper foil, and heated in air to 300° C. for 30 minutes, so as to produce a copper clad laminate. Subsequently, a circuit pattern having a width of 3 mm was formed by etching under the same condition as in the test A, and then subjected to soft etching under the same condition as in the test B.
In the tests A to C, a specimen having the length of the portion where the soft etching solution infiltrated of 5 μm or less was evaluated as "good", and a specimen having the length exceeding 5 μm was evaluated as "poor". The evaluation results are shown in Table 2.

TABLE 2

| | First surface treatment layer | | | | Second surface treatment layer | | | | | | Infiltration of etching solution | | |
|---|---|---|---|---|---|---|---|---|---|---|---|---|---|
| | Deposited amount of Ni (μg/dm²) | Deposited amount of Zn (μg/dm²) | Deposited amount of Co (μg/dm²) | Deposited amount of Cr (μg/dm²) | Deposited amount of Ni (μg/dm²) | Deposited amount of Zn (μg/dm²) | Deposited amount of Cr (μg/dm²) | Ratio of deposited amount of Ni [1] | Rz (μm) | EF | Test A | Test B | Test C |
| Example 3 | 52 | 166 | 0 | 50 | 67 | 321 | 22 | 0.77 | 0.74 | 3.48 | good | good | good |
| Example 4 | 77 | 346 | 0 | 50 | 67 | 321 | 22 | 1.15 | 0.67 | 4.25 | good | good | good |
| Example 5 | 93 | 419 | 0 | 48 | 67 | 321 | 22 | 1.39 | 0.66 | 3.97 | good | good | good |
| Example 6 | 146 | 615 | 0 | 50 | 67 | 321 | 22 | 2.17 | 0.73 | 3.74 | good | good | good |

TABLE 2-continued

| | First surface treatment layer | | | | Second surface treatment layer | | | | | | Infiltration of etching solution | | |
|---|---|---|---|---|---|---|---|---|---|---|---|---|---|
| | Deposited amount of Ni (μg/dm$^2$) | Deposited amount of Zn (μg/dm$^2$) | Deposited amount of Co (μg/dm$^2$) | Deposited amount of Cr (μg/dm$^2$) | Deposited amount of Ni (μg/dm$^2$) | Deposited amount of Zn (μg/dm$^2$) | Deposited amount of Cr (μg/dm$^2$) | Ratio of deposited amount of Ni [1] | Rz (μm) | EF | Test A | Test B | Test C |
| Example 7 | 77 | 346 | 0 | 50 | 44 | 251 | 21 | 1.75 | 0.68 | 4.16 | good | good | good |
| Example 8 | 77 | 346 | 0 | 50 | 93 | 375 | 22 | 0.83 | 0.70 | 3.81 | good | good | good |

[1] Ratio of deposited amount of Ni of first surface treatment layer to deposited amount of Ni of second surface treatment layer As shown in Table 2, the surface treated copper foils of Examples 3 to 8 each having a deposited amount of Ni of 20 to 200 μg/dm$^2$ and a deposited amount of Zn of 20 to 1,000 μg/dm$^2$ in the first surface treatment layer exhibited a high etching factor (EF), as similar to Examples 1 and 2. The surface treated copper foils of Examples 3 to 8 exhibited less infiltration of the soft etching solution to the edge portion of the circuit pattern.

It is understood from the aforementioned results that one or more embodiments of the present application can provide a surface treated copper foil and a copper clad laminate that are suitable for the reduction in pitch of the circuit pattern and capable of forming a circuit pattern having a high etching factor.

One or more embodiments of the present application can also provide a printed circuit board that has a circuit pattern having a high etching factor.

One or more embodiments of the present application may also be in the following embodiments.

<1>
A surface treated copper foil including
a copper foil, and
a first surface treatment layer formed on one surface of the copper foil,
wherein the first surface treatment layer has a Ni deposited amount of 20 to 200 μg/dm$^2$ and a Zn deposited amount of 20 to 1,000 μg/dm$^2$.

<2>
The surface treated copper foil according to the item <1>, wherein the Ni deposited amount of the first surface treatment layer is from 20 to 180 μg/dm$^2$.

<3>
The surface treated copper foil according to the item <2>, wherein the Ni deposited amount of the first surface treatment layer is from 30 to 100 μg/dm$^2$.

<4>
The surface treated copper foil according to any one of the items <1> to <3>, wherein the Zn deposited amount of the first surface treatment layer is from 100 to 700 μg/dm$^2$.

<5>
The surface treated copper foil according to the item <4>, wherein the Zn deposited amount of the first surface treatment layer is from 300 to 500 μg/dm$^2$.

<6>
The surface treated copper foil according to any one of the items <1> to <5>, wherein the first surface treatment layer has a Co deposited amount of 30 μg/dm$^2$ or less.

<7>
The surface treated copper foil according to any one of the items <1> to <6>, wherein the first surface treatment layer has Rz of 0.3 to 1.5 μm.

<8>
The surface treated copper foil according to the item <7>, wherein the Rz of the first surface treatment layer is from 0.4 to 1.2 μm.

<9>
The surface treated copper foil according to the item <7>, wherein the Rz of the first surface treatment layer is from 0.5 to 0.9 μm.

<10>
The surface treated copper foil according to any one of the items <1> to <9>, wherein the surface treated copper foil further includes a second surface treatment layer formed on the other surface of the copper foil.

<11>
The surface treated copper foil according to the item <10>, wherein a ratio of the Ni deposited amount of the first surface treatment layer to a Ni deposited amount of the second surface treatment layer of 0.01 to 2.5.

<12>
The surface treated copper foil according to the item <11>, wherein the ratio of the Ni deposited amounts is from 0.6 to 2.2.

<13>
The surface treated copper foil according to any one of the items <1> to <12>, wherein the copper foil is a rolled copper foil.

<14>
The surface treated copper foil according to any one of the items <1> to <13>, wherein the first surface treatment layer is to be adhered to an insulating substrate.

<15>
A copper clad laminate including
the surface treated copper foil according to any one of the items <1> to <14>, and
an insulating substrate adhered to the first surface treatment layer of the surface treated copper foil.

<16>
A printed circuit board including a circuit pattern formed by etching the surface treated copper foil of the copper clad laminate according to the item <15>.

REFERENCE SIGN LIST

1 Surface treated copper foil
2 Copper foil
3 First surface treatment layer
4 Second surface treatment layer
10 Copper clad laminate
11 Insulating substrate
20 Resist pattern

The invention claimed is:
1. A surface treated copper foil comprising
a copper foil, and
a first surface treatment layer formed on one surface of the copper foil, and a second surface treatment layer formed on the other surface of the copper foil, wherein the first surface treatment layer comprises a Ni deposited amount of 20 to 200 μg/dm² and a Zn deposited amount of more than 300 μg/dm² to 1,000 μg/dm², and the second surface treatment layer comprises a Zn deposited amount of 10 to 1000 μg/dm².

2. The surface treated copper foil according to claim 1, wherein the Ni deposited amount of the first surface treatment layer is from 20 to 180 μg/dm².

3. The surface treated copper foil according to claim 2, wherein the Ni deposited amount of the first surface treatment layer is from 30 to 100 μg/dm².

4. The surface treated copper foil according to claim 1, wherein the Zn deposited amount of the first surface treatment layer is from 346 to 700 μg/dm².

5. The surface treated copper foil according to claim 4, wherein the Zn deposited amount of the first surface treatment layer is from 346 to 500 μg/dm².

6. The surface treated copper foil according to claim 1, wherein the first surface treatment layer comprises a Co deposited amount of 30 μg/dm² or less.

7. The surface treated copper foil according to claim 1, wherein the first surface treatment layer comprises Rz of 0.3 to 1.5 μm.

8. The surface treated copper foil according to claim 7, wherein the Rz of the first surface treatment layer is from 0.4 to 1.2 μm.

9. The surface treated copper foil according to claim 7, wherein the Rz of the first surface treatment layer is from 0.5 to 0.9 μm.

10. The surface treated copper foil according to claim 1, wherein a ratio of the Ni deposited amount of the first surface treatment layer to a Ni deposited amount of the second surface treatment layer is 0.01 to 2.5.

11. The surface treated copper foil according to claim 10, wherein the ratio of the Ni deposited amounts is from 0.6 to 2.2.

12. The surface treated copper foil according to claim 1, wherein the copper foil is a rolled copper foil.

13. The surface treated copper foil according to claim 1, wherein the first surface treatment layer is to be adhered to an insulating substrate.

14. A copper clad laminate comprising the surface treated copper foil according to claim 1, and an insulating substrate adhered to the first surface treatment layer of the surface treated copper foil.

15. A printed circuit board comprising a circuit pattern formed by etching the surface treated copper foil of the copper clad laminate according to claim 14.

16. The surface treated copper foil according to claim 5, wherein a ratio of the Ni deposited amount of the first surface treatment layer to a Ni deposited amount of the second surface treatment layer is 0.01 to 2.5.

17. The surface treated copper foil according to claim 16, wherein the ratio of the Ni deposited amounts is from 0.6 to 2.2.

18. The surface treated copper foil according to claim 17, wherein the first surface treatment layer comprises a Co deposited amount of 30 μg/dm² or less.

19. The surface treated copper foil according to claim 18, wherein the first surface treatment layer comprises Rz of 0.3 to 1.5 μm.

* * * * *